(12) United States Patent
Chang

(10) Patent No.: US 8,032,099 B2
(45) Date of Patent: *Oct. 4, 2011

(54) AUTOMATIC GAIN CONTROL CIRCUIT USING GAIN SHIFT

(75) Inventor: Yum-Cheng Chang, Mission Viejo, CA (US)

(73) Assignee: Fitipower Integrated Technology, Inc., Miaoli County (TW)

( * ) Notice: Subject to any disclaimer, the term of this patent is extended or adjusted under 35 U.S.C. 154(b) by 593 days.

This patent is subject to a terminal disclaimer.

(21) Appl. No.: 12/182,344

(22) Filed: Jul. 30, 2008

(65) Prior Publication Data

US 2009/0111415 A1 Apr. 30, 2009

(30) Foreign Application Priority Data

Oct. 30, 2007 (CN) .......................... 2007 1 0165498

(51) Int. Cl.
*H04B 1/06* (2006.01)
(52) U.S. Cl. ................ 455/234.1; 455/232.1; 455/250.1
(58) Field of Classification Search ............... 455/127.2, 455/136, 138, 219, 232.1, 234.1, 250.1; 375/345
See application file for complete search history.

(56) References Cited

U.S. PATENT DOCUMENTS

| | | | | |
|---|---|---|---|---|
| 5,450,035 A | * | 9/1995 | Kinoshita | 330/129 |
| 5,784,410 A | * | 7/1998 | Nakano | 375/345 |
| 6,718,165 B1 | * | 4/2004 | Ha | 455/234.2 |
| 6,748,200 B1 | * | 6/2004 | Webster et al. | 455/234.1 |
| 7,333,782 B2 | * | 2/2008 | Kim | 455/127.1 |
| 7,386,285 B2 | * | 6/2008 | Yamauchi | 455/136 |
| 7,596,192 B2 | * | 9/2009 | Furuya | 375/345 |
| 7,684,771 B2 | * | 3/2010 | Blair et al. | 455/127.1 |
| 7,916,798 B2 | * | 3/2011 | Aytur et al. | 375/260 |

FOREIGN PATENT DOCUMENTS

CN 1423486 A 6/2003

OTHER PUBLICATIONS

Guang-Ming Wang et al. The method to realize programmable gain amplifier,Journal of Electric Engineer, Apr. 30, 2002,58-60, 28-4,Chinese academic Journal Electronic Publishing House,CN.

* cited by examiner

*Primary Examiner* — Sonny Trinh
(74) *Attorney, Agent, or Firm* — Altis Law Group, Inc.

(57) ABSTRACT

An AGC circuit includes a low noise RF amplifying module with an adjustable gain, a frequency converter, an IF/Baseband amplifying module with an adjustable gain, an A/D converter, an AGC module and a gain distribution module. The AGC module is configured for detecting a level of a digital IF/Baseband signal outputted from the A/D converter, comparing the detected level with a reference level and generating a digital AGC signal and a digital gain distribution control signal based upon the comparison result. The gain distribution module is subject to control of the digital AGC signal and digital gain distribution control signal and configured for generating digital gain control signals to selectively adjust at least one of the gains of the low noise RF amplifying module and the IF/Baseband amplifying module in a digital manner to keep an IF/Baseband signal outputted from the IF/Baseband amplifying module at a desired level.

8 Claims, 4 Drawing Sheets

AUTOMATIC GAIN CONTROL CIRCUIT USING GAIN SHIFT

CROSS-REFERENCE TO RELATED APPLICATIONS

This application claims all benefits accruing under 35 U.S.C. §119 from China Patent Application No. 200710165498.7, filed on Oct. 30, 2007 in the China Intellectual Property Office, the disclosure of which is incorporated herein by reference.

BACKGROUND

1. Technical Field

The present invention generally relates to automatic gain control circuits, and particularly to an automatic gain control circuit used in digital television receivers.

2. Description of Related Art

Digital televisions have the advantages of higher definition (or higher resolution) and compact disc (CD) level multi-channel audio output as compared to traditional analog televisions. Nowadays, various countries such as United States, Europe and Japan have already established their own digital television broadcast formats, e.g., vestigial sideband ("VSB") for the United States. The detailed information with respect to the VSB broadcast format has been published in a paper by Wayne et al. on IEEE Transactions on Consumer Electronics, vol. 41, No. 3 (August 1995), entitled "VSB Modem Subsystem Design for Grand Alliance Digital Television Receivers", the disclosure of which is incorporated herein by reference.

A typical digital television receiver primarily includes an antenna for receiving radio frequency (RF) signals (i.e., generally high frequency signals), a tuner for channel select, an automatic gain control circuit and a demodulator. The automatic gain control circuit generally includes a low noise RF amplifier, a frequency converter, an Intermediate Frequency (IF)/Baseband amplifier, and an analog-to-digital (A/D) converter and an automatic gain controller. The low noise RF amplifier is for amplifying an RF signal of the selected channel. The frequency converter is for converting the selected RF signal into an intermediate frequency (IF) signal/baseband (zero-IF) signal. The IF/Baseband amplifier is for amplifying the IF/Baseband signal to be an amplified IF/Baseband signal. The A/D converter is for converting the amplified IF/Baseband signal into a digital IF/Baseband signal. The digital IF/Baseband signal is outputted to the demodulator for demodulation as well as the automatic gain controller. The automatic gain controller receives the digital IF/Baseband signal, compares the digital IF/Baseband signal with a reference level and then generates gain control signals in analog form to independently control gains of the low noise RF amplifier and the IF/Baseband amplifier, so as to regulate the signal outputted from the IF/Baseband amplifier at a desired level.

For the above-described low noise RF amplifier, when the low noise RF amplifier receives relatively weak RF signals, gain (or magnification) of the RF signals can be increased to improve the noise performance of the digital television receiver. When receiving strong RF signals, a linearity of the gain of RF signals may not accurately adjust and signal distortion may occur. As a result, the performance of the digital television receiver will degrade.

Therefore, what is needed is an automatic gain control circuit which includes a low noise RF amplifier and a gain thereof has an improved linearity and can be accurately adjust.

SUMMARY

An automatic gain control (AGC) circuit in accordance with a present embodiment is provided. The AGC circuit includes a low noise RF amplifying module with an adjustable gain, a frequency converter, an IF/Baseband amplifying module with an adjustable gain, an A/D converter, an AGC module and a gain distribution module. The low noise RF amplifying module is configured (i.e., structured and arranged) for amplifying a high frequency signal to be an amplified high frequency signal with the same frequency. The frequency converter is configured for converting the amplified high frequency signal into an IF/Baseband signal. The IF/Baseband amplifying module is configured for amplifying the IF/Baseband signal to be an amplified IF/Baseband signal with the same frequency. The A/D converter is configured for converting the amplified IF/Baseband signal into a digital IF/Baseband signal. The AGC module is configured for detecting a level of the digital IF/Baseband signal, comparing the detected level with a reference level and generating a digital AGC signal and a digital gain distribution control signal based upon the comparison result. The gain distribution module is subject to the control of the digital AGC signal and the digital gain distribution control signal and configured for generating digital gain control signals to selectively adjust at least one of the gains of the low noise RF amplifying module and the IF/Baseband amplifying module in a digital manner to keep the amplified IF/Baseband signal at a desired level.

Due to the provision of the AGC module and the gain distribution module and corresponding circuit designs for the low noise RF amplifying module and IF/Baseband amplifying module, digital gain control signals can be generated to selectively adjust the gains of the low noise RF amplifying module and the IF/Baseband amplifying module in a digital manner. In one aspect, the selective adjustment of the gains facilitates the low noise RF amplifying module to achieve a best compromised performance between the noise and the linearity. In another aspect, the digital manner for gain adjustment compared to the conventional analog manner is more flexible and thus can simplify the AGC interface.

Other advantages and novel features will become more apparent from the following detailed description of embodiments, when taken in conjunction with the accompanying drawings.

BRIEF DESCRIPTION OF THE DRAWINGS

Many aspects of the present AGC circuit can be better understood with reference to the following drawings. The components in the drawings are not necessarily drawn to scale, the emphasis instead being placed upon clearly illustrating the principles of the present AGC circuit. Moreover, in the drawings, like reference numerals designate corresponding parts throughout the several views.

The exemplifications set out herein illustrate various preferred embodiments, in various forms, and such exemplifications are not to be construed as limiting the scope of the present AGC circuit in any manner.

DETAILED DESCRIPTION

Figure 1:
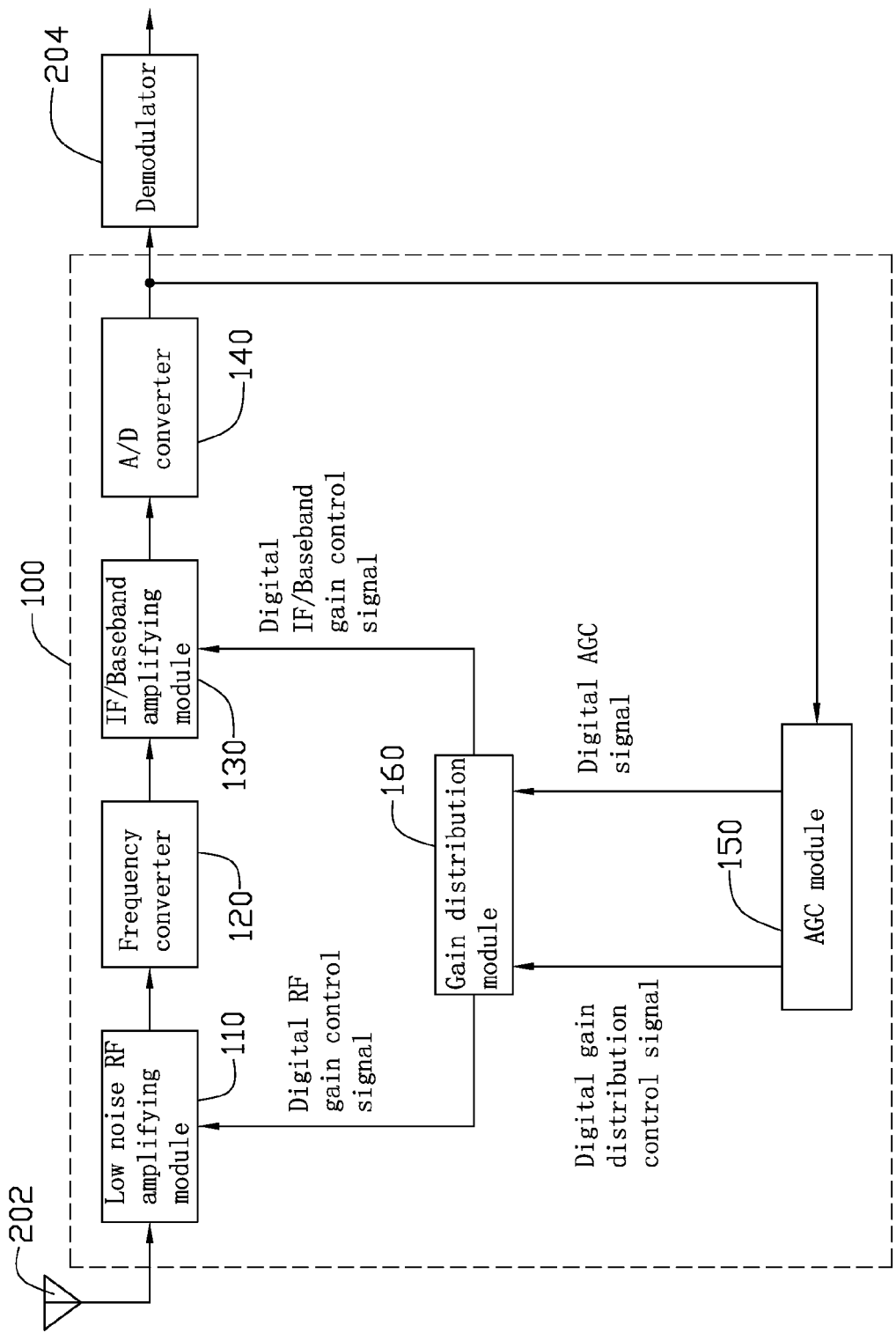
FIG. 1 is a schematic, functional block diagram of an AGC circuit, in accordance with a present embodiment, the AGC circuit including a low noise RF amplifying module and an IF/Baseband amplifying module.

Referring to FIG. 1, an AGC circuit 100 adapted to a digital television receiver, in accordance with a present embodiment, is provided. The AGC circuit 100 includes a low noise RF amplifying module 110, a frequency converter 120, an IF/Baseband amplifying module 130, an A/D converter 140, an AGC module 150 and a gain distribution module 160.

The low noise RF amplifying module 110 has an adjustable gain. The low noise RF amplifying module 110 is configured for amplifying a high frequency signal (such as radio-frequency signal) received from an antenna 202 to be an amplified high frequency signal with the same frequency, that is, the frequency of the signal was unchanged. The low noise RF amplifying module 110 may include one amplifying stage or multiple amplifying stages coupled in series with one another. Each amplifying stage contains one or a group of low noise RF amplifying circuit(s), and each low noise RF amplifying circuit can be subject to the control of a digital control signal to change a gain thereof and thereby the gain of the low noise RF amplifying module 110 can be adjusted.

Figure 2:
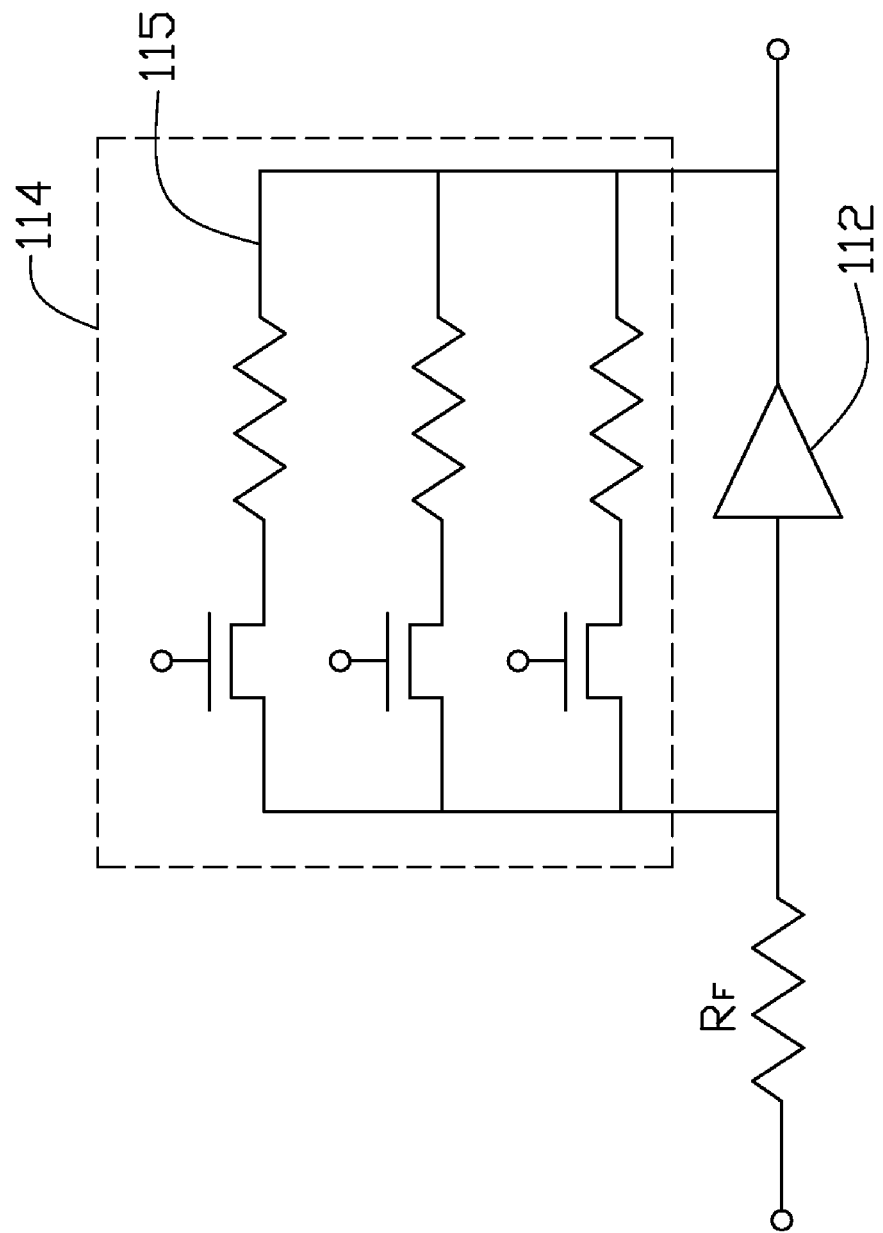
FIG. 2 is a schematic, simplified circuit diagram of a low noise RF amplifying circuit of the low noise RF amplifying module of FIG. 1.

Referring to FIG. 2, a simplified circuit diagram of the low noise RF amplifying circuit is illustrated. The low noise RF amplifying circuit includes an input resistor $R_F$, a low noise RF amplifier 112 and a digital switch circuit 114 coupled in parallel with the low noise RF amplifier 112. The digital switch circuit 114 includes multiple digital switch units 115 coupled in parallel with one another. Therefore, the gain of the low noise RF amplifying circuit can be changed by a digital control signal selectively controlling the on/off states of the digital switch units 115. It is indicated that the simplified circuit configuration of the low noise RF amplifying circuit in FIG. 2 is only an example for the purpose of illustrating the low noise RF amplifying circuit can be subject to a digital control signal to change a gain thereof, other suitable circuit configuration also can be employed.

The frequency converter 120 is configured for converting the amplified high frequency signal outputted from the low noise RF amplifying module 110 into an IF/Baseband signal. Typically, the frequency converter 120 includes a local oscillator and a frequency mixer. The IF/Baseband signal can be generated by mixing a signal with local frequency generated from the local oscillator and the amplified high frequency signal.

The IF/Baseband amplifying module 130 has an adjustable gain. The IF/Baseband amplifying module 130 is configured for amplifying the IF/Baseband signal to be an amplified IF/Baseband signal with the same frequency. The IF/Baseband amplifying module 130 may include one or multiple amplifying stage(s) coupled in series with one another. Each amplifying stage contains one or a group of IF/Baseband amplifying circuit(s), and each IF/Baseband amplifying circuit can be subject to the control of a digital control signal to change a gain thereof and thereby the gain of the IF/Baseband amplifying module 130 can be adjusted.

Figure 3:
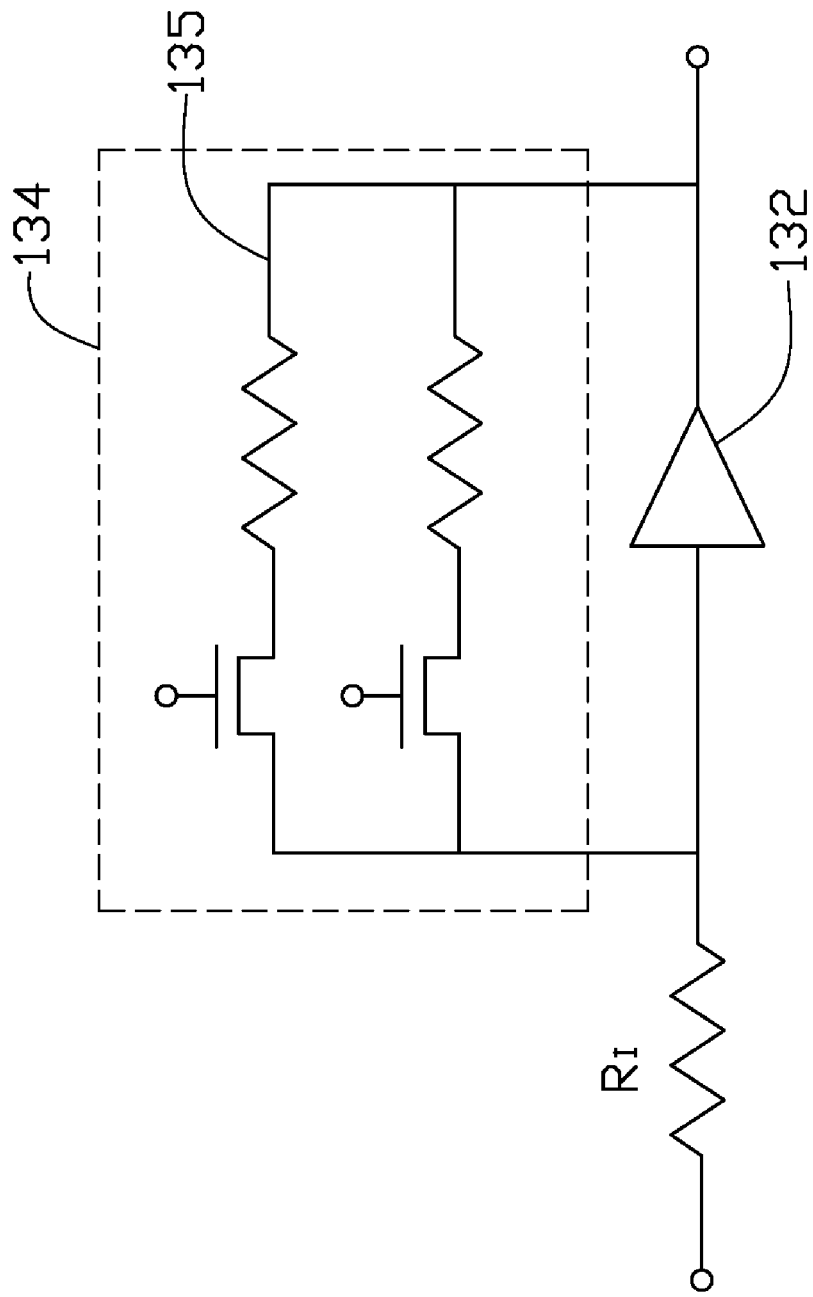
FIG. 3 is a schematic, simplified circuit diagram of an IF/Baseband amplifying circuit of the IF/Baseband amplifying module of FIG. 1.

Referring to FIG. 3, a simplified circuit diagram of the IF/Baseband amplifying circuit is illustrated. The IF/Baseband amplifying circuit includes an input resistor $R_I$, an IF/Baseband amplifier 132 and a digital switch circuit 134 coupled in parallel with the IF/Baseband amplifier 132. The digital switch circuit 134 includes multiple digital switch units 135 coupled in parallel with one another. Therefore, the gain of the IF/Baseband amplifying circuit can be changed by a digital control signal selectively controlling the on/off states of the digital switch units 135. It is indicated that the simplified circuit configuration of the IF/Baseband amplifying circuit in FIG. 3 is only an example for the purpose of illustrating the IF/Baseband amplifying circuit can be subject to a digital control signal to change a gain thereof, other suitable circuit configuration also can be employed.

The A/D converter 140 is configured for converting the amplified IF/Baseband signal from the IF/Baseband amplifying module 130 into a digital IF/Baseband signal. The digital IF/Baseband then is sent to a demodulator 204 as well as the AGC module 150.

The AGC module 150 is configured for detecting a level of the digital IF/Baseband signal, comparing the detected level with a reference level and generating a digital AGC signal and a digital gain distribution control signal based upon the comparison result. The digital AGC signal is used for setting a total gain value of the low noise RF amplifying module 110 and the IF/Baseband amplifying module 130. The digital gain distribution control signal is used for setting gain values distributed to the low noise RF amplifying module 110 and the IF/Baseband amplifying module 130. The digital AGC signal and the digital gain distribution control signal, each may be a pulse width modulation (PWM) signal, a pulse density modulation (PDM) signal, a I2C signals or a general logic signal.

The gain distribution module 160 is subject to the control of the digital AGC signal and the digital gain distribution control signal, and configured for generating corresponding digital gain control signals to selectively adjust at least one of the gains of the low noise RF amplifying module 110 and the IF/Baseband amplifying module 130, to keep the IF/Baseband signal at a desired level. The digital gain control signals comprises a digital RF gain control signal and a digital IF/Baseband gain control signal for respectively controlling the gains of the low noise RF amplifying module 110 and the IF/Baseband amplifying module 130.

Figure 4:
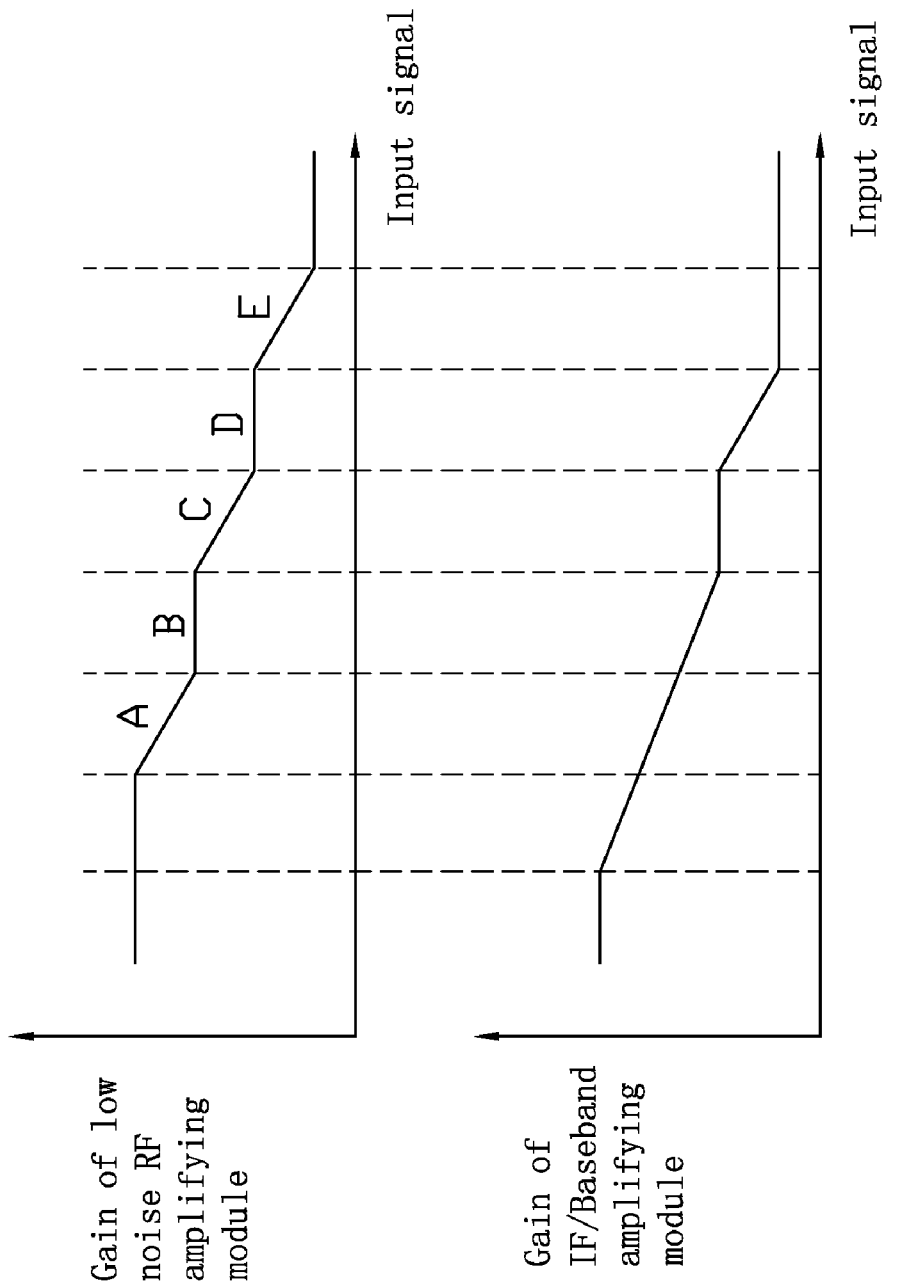
FIG. 4 shows gain characteristic curves of the low noise RF amplifying module and the IF/Baseband amplifying module of the AGC circuit of FIG. 1.

A gain adjustment method of the AGC circuit 100 will be described below in detailed with reference to an accompanying drawing. FIG. 4 shows gain characteristic curves of the low noise RF amplifying module 110 and the IF/Baseband amplifying module 130 of the AGC circuit 100 versus a gradually increased input signal from the antenna 202. In particular, when the input signal from the antenna 202 gradually increases, gain adjustments for the low noise RF amplifying module 110 and the IF/Baseband amplifying module 130 can be achieved by the following approaches: (1) at the adjustment segment A of the gain characteristic curve of the low noise RF amplifying module 110, gains of the low noise RF amplifying module 110 and the IF/Baseband amplifying module 130 both are adjusted. (2) At the hold segment B, the gain of the low noise RF amplifying module 110 is kept constant while the gain of the IF/Baseband amplifying module 130 is adjusted; in another words, the gain is shifted to the IF/Baseband amplifying module 130 for adjustment. (3) At the adjustment segment C, the gain of the low noise RF amplifying module 110 is adjusted while the gain of the IF/Baseband amplifying module 130 is kept constant. (4) At the hold segment D, the gain of the low noise RF amplifying module 110 is kept constant while the gain of the IF/Baseband amplifying module 130 is adjusted; that is, the gain is shifted to the IF/Baseband amplifying module 130 for adjustment. (5) At the adjustment segment E, the gain of the low noise RF amplifying module 110 is adjusted while the gain of the IF/Baseband amplifying module 130 is kept constant. Because the gain and linearity characteristics of the low noise RF amplifying module 110 and the IF/Baseband amplifying module 130 are appropriately controlled by gain shift, different gain and linearity characteristics can constitute different combinations, and the combinations can be determined by software program, gain shift points (i.e., generally start points and end points of the adjustment segments) of the low noise RF amplifying module 110 can be set via programming. Accordingly, each of the adjustment segments (e.g., adjustments A, C and E) can achieve a good gain linearity and thus the gain of the low noise RF amplifying module 110 can be accurately adjusted, so that best compromised performance between the noise and the linearity for the low noise RF amplifying module 110 can be readily achieved. Furthermore, as seen from FIG. 4, the adjustment segments A, C, E and the hold segments B, D of the gain characteristic curve of the low noise RF amplifying module 110 are alternately connected with one another; adjustment segments (not labeled) of the gain characteristic curve of the IF/Baseband amplifying module 130 each also are given a good gain linearity.

In summary, as to the AGC circuit 100 in accordance with the above-mentioned embodiment, due to the provision of the AGC module 150 and the gain distribution module 160 and corresponding circuit designs for the low noise RF amplifying module 110 and IF/Baseband amplifying module 130, digital gain control signals (i.e., generally including digital RF gain control signal and digital IF/Baseband gain control signal) can be appropriately generated to selectively adjust at least one of the gains of the low noise RF amplifying module 110 and the IF/Baseband amplifying module 130 in a digital manner. In one aspect, the selective adjustment of the gains facilitates the low noise RF amplifying module to achieve a best compromised performance between the noise and the linearity. In another aspect, the digital manner for gain adjustment compared to the conventional analog manner is more flexible and thus can simplify the AGC interface.

In addition, a person skilled in the art can perform various changes within the spirit of the present embodiment, such as changing the circuit configuration(s) of the low noise RF amplifying module 110 and/or the IF/Baseband amplifying module 130, etc.

It is believed that the present embodiments and their advantages will be understood from the foregoing description and it will be apparent that various changes may be made thereto without departing from the spirit and scope of the invention or sacrificing all of its material advantages, the examples hereinbefore described merely being preferred or exemplary embodiments of the present invention.

What is claimed is:

1. An automatic gain control (AGC) circuit, comprising:
a low noise RF amplifying module with an adjustable gain, configured for amplifying a received high frequency signal to be an amplified high frequency signal with the same frequency;
a frequency converter configured for converting the amplified high frequency signal into an IF/Baseband signal;
an IF/Baseband amplifying module with an adjustable gain, configured for amplifying the IF/Baseband signal to be an amplified IF/Baseband signal;
an A/D converter configured for converting the amplified IF/Baseband signal into a digital IF/Baseband signal;
an AGC module configured for detecting a level of the digital IF/Baseband signal, comparing the detected level with a reference level and generating a digital AGC signal and a digital gain distribution control signal based upon the comparison result; and
a gain distribution module subject to the control of the digital AGC signal and the digital gain distribution control signal and configured for generating digital gain control signals to selectively adjust at least one of the gains of the low noise RF amplifying module and the IF/Baseband amplifying module in a digital manner to keep the IF/Baseband signal outputted from the IF/Baseband amplifying module at a desired level.

2. The AGC circuit of claim 1, wherein the low noise RF amplifying module comprises at least one amplifying stage and each of the at least one amplifying stage comprises a digital switch circuit, the digital switch circuit is subject to the control of a digital RF gain control signal of the digital gain control signals and configured for controlling the gain of the low noise RF amplifying module.

3. The AGC circuit of claim 2, wherein a number of the at least one amplifying stage is multiple, and the multiple amplifying stages coupled in series with one another.

4. The AGC circuit of claim 1, wherein the IF/Baseband amplifying module comprises at least one amplifying stage and each of the at least one amplifying stage comprises a digital switch circuit, the digital switch circuit is subject to the control of a digital IF/Baseband gain control signal of the digital gain control signals and configured for controlling the gain of the IF/Baseband amplifying module.

5. The AGC circuit of claim 4, wherein a number of the at least one amplifying stage is multiple, and the multiple amplifying stages coupled in series with one another.

6. The AGC circuit of claim 1, wherein the digital AGC signal is selected from the group consisting of a pulse width modulation signal, a pulse density modulation signal, an I2C signal and a general logic signal.

7. The AGC circuit of claim 1, wherein the digital gain distribution control signal is selected from the group consisting of a pulse width modulation signal, a pulse density modulation signal, an I2C signal and a general logic signal.

8. An automatic gain control (AGC) circuit, comprising:
a low noise RF amplifying module with an adjustable gain, configured for amplifying a received high frequency signal to be an amplified high frequency signal with the same frequency;
a frequency converter configured for converting the amplified high frequency signal into an IF/Baseband signal;
an IF/Baseband amplifying module with an adjustable gain, configured for amplifying the IF/Baseband signal to be an amplified IF/Baseband signal;
an A/D converter configured for converting the amplified IF/Baseband signal into a digital IF/Baseband signal;
an AGC module configured for detecting a level of the digital IF/Baseband signal, comparing the detected level with a reference level and generating a digital AGC signal and a digital gain distribution control signal based upon the comparison result; and
a gain distribution module subject to the control of the digital AGC signal and the digital gain distribution control signal and configured for generating digital gain control signals to selectively adjust at least one of the gains of the low noise RF amplifying module and the IF/Baseband amplifying module in a digital manner to keep the IF/Baseband signal outputted from the IF/Baseband amplifying module at a desired level, wherein a gain characteristic curve of the low noise RF amplifying module comprises a plurality of adjustment segments and a plurality of hold segments, the adjustment segments and the hold segments are alternately connected with one another.

* * * * *